(12) United States Patent
Chinone et al.

(10) Patent No.: US 8,323,604 B2
(45) Date of Patent: Dec. 4, 2012

(54) CERIUM SALT, PRODUCING METHOD THEREOF, CERIUM OXIDE AND CERIUM BASED POLISHING SLURRY

(75) Inventors: Kanshi Chinone, Hitachi (JP); Seiji Miyaoka, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 196 days.

(21) Appl. No.: 12/886,209

(22) Filed: Sep. 20, 2010

(65) Prior Publication Data

US 2011/0006251 A1 Jan. 13, 2011

Related U.S. Application Data

(62) Division of application No. 10/571,583, filed as application No. PCT/JP2004/013118 on Sep. 9, 2004, now abandoned.

(30) Foreign Application Priority Data

Sep. 12, 2003 (JP) ................................ 2003-320667

(51) Int. Cl.
- *C01F 17/00* (2006.01)
- *B24D 3/02* (2006.01)
- *C09C 1/68* (2006.01)
- *C09K 3/14* (2006.01)

(52) U.S. Cl. .............. 423/263; 51/307; 51/308; 51/309; 252/79.1

(58) Field of Classification Search .................. 423/263; 51/307–309; 252/79.1
See application file for complete search history.

(56) References Cited

U.S. PATENT DOCUMENTS

| 5,772,780 A | 6/1998 | Homma et al. |
| 6,043,155 A | 3/2000 | Homma et al. |
| 6,120,571 A | 9/2000 | Aihara et al. |
| 6,420,269 B2 | 7/2002 | Matsuzawa et al. |
| 6,478,836 B1 | 11/2002 | Kido et al. |
| 6,602,111 B1 | 8/2003 | Fujie et al. |

FOREIGN PATENT DOCUMENTS

| JP | 35-10850 | 8/1960 |
| JP | 53-095900 A | 8/1978 |
| JP | 7-144915 A | 6/1995 |
| JP | 8-153696 A | 6/1996 |
| JP | 09-183966 A | 7/1997 |
| JP | 11-12561 A | 1/1999 |
| JP | 2000-026840 A | 1/2000 |
| JP | 2001-089748 A | 4/2001 |
| JP | 2001-189291 A | 7/2001 |
| JP | 2002-220229 A | 8/2002 |
| JP | 2002-371267 A | 12/2002 |
| JP | 2003-105326 A | 4/2003 |
| JP | 2003-252622 A | 9/2003 |
| WO | 00/37578 A1 | 6/2000 |

OTHER PUBLICATIONS

T. Honma et al.; "Effect of Various Factors on Grinding Using Jet Mill"; Chemical Industrial Paper Collection, 1980, pp. 527-532, vol. 6, No. 5.
G. F. Smith et al.; "Hexanitrato Ammonium Cerate as a Proposed Reference Standard in Oxidimetry"; Industrial and Engineering Chemistry, Nov. 15, 1936, pp. 449-451, vol. 8, No. 6.
Chinese Office Action dated Oct. 9, 2009, issued in corresponding Chinese Patent Application No. 2004800257778.
International Search Report of PCT/JP2004/013118, mailing date of Dec. 21, 2004.
Japanese Office Action dated Feb. 24, 2009, issued in corresponding Japanese Patent Application No. 2005-513887.
Japanese Office Action dated May 26, 2009, issued in corresponding Japanese Patent Application No. 2005-513887.
Tawainese Office Action dated Jan. 30, 2007, issued in corresponding Taiwanese Patent Application No. 09620070230.
Chinese Office Action dated Sep. 21, 2011, issued in corresponding Chinese Patent Application No. 201010238216.3.
Japanese Office Action dated Jul. 24, 2012, issued in corresponding Japanese Patent Application No. 2009-194508, with English translation (9 pages).

*Primary Examiner* — Pegah Parvini
(74) *Attorney, Agent, or Firm* — Westerman, Hattori, Daniels & Adrian, LLP

(57) ABSTRACT

A cerium salt wherein, when 20 g of the cerium salt is dissolved in a mixed liquid of 12.5 g of 6N nitric acid and 12.5 g of a 30% hydrogen peroxide aqueous solution, a concentration of an insoluble component present in the solution is 5 ppm or less by mass ratio to the cerium salt before dissolution and cerium oxide produced by processing the cerium salt at high temperatures. Scratch on a surface to be polished can be reduced when a cerium based polishing slurry containing the cerium oxide particles is used, since an amount of impurities in cerium oxide particles and cerium salt particles, raw material thereof, is reduced for high purification.

13 Claims, No Drawings

CERIUM SALT, PRODUCING METHOD THEREOF, CERIUM OXIDE AND CERIUM BASED POLISHING SLURRY

CROSS-REFERENCE TO RELATED APPLICATIONS

This application is a divisional of U.S. application Ser. No. 10/571,583, filed on Mar. 10, 2006, which is a 371 of International Application No. PCT/JP2004/013118 filed on Sep. 9, 2004, which is based upon and claims the benefit of priority from the prior Japanese Patent Application No. 2003-320667, filed on Sep. 12, 2003, the entire contents of which are incorporated herein by reference.

TECHNICAL FIELD

The present invention relates to a high purity cerium salt in which impurity particles are reduced and a producing method thereof, cerium oxide obtained by processing the cerium salt at a high temperature, and a cerium based polishing slurry that uses the cerium oxide.

BACKGROUND ART

As examples that necessitate accurately polishing a surface of a material, an optical disc substrate, a magnetic disc, a glass substrate for use in flat panel displays, a watch plate, a camera lens, a glass material used for various kinds of lenses for use in optical components, a crystal material such as filters, a substrate such as silicon wafer for use in semiconductor or the like, and an insulating film, a metal layer, a barrier layer and so on formed in the respective steps in the manufacture of a semiconductor device can be cited. Surfaces of the materials are required to polish with high precision. Accordingly, a polishing agent in which for instance silica, zirconium oxide, alumina and so on are used singularly or in a combination of at least two kinds thereof as polishing particles is generally used. As a form of the polishing agent, for instance, one in state of slurry in which polishing particles are dispersed in a liquid, one in which polishing particles are solidified together with a binder such as a resin or others, and one in which polishing particles are adhered and/or fixed on a surface of a base material such as fiber, resin, metal or the like by use of fine particles alone or together with a binder are generally used as the polishing agent.

In particular, since a silica based polishing slurry where fine particles of silica are used as polishing particles generate less scratch on a surface being polished, it is widely used as a precision polishing slurry of semiconductor integrated circuits. However, since the polishing speed thereof is slow, recently, a cerium oxide based polishing slurry containing cerium oxide, which is rapid in the polishing speed is gathering attention (Japanese Patent Application Laid-Open Nos. 2000-26840 and 2002-371267). However, there is a problem in that the cerium oxide based polishing slurry is much in the scratch relative to the silica based polishing slurry.

Cerium oxide used mainly in the cerium based polishing slurry can be produced by calcining a cerium salt at a high temperature followed by as needs arise pulverizing and classifying.

In the beginning, as a method of producing the cerium salt, for instance, firstly, a cerium compound such as an ore containing rare earths containing at least cerium (bastnaesite ore, heavy sand, parankerite and so on) or the like is subjected to a mineral processing (separation, acid leaching and so on) to remove other valuable matters and unnecessary veinstones, and thereby a rare earth concentrate (bastnaesite concentrate, monazite concentrate, Chinese complex concentrate and so on) is obtained. In the next place, the rare earth concentrate is chemically processed (alkali decomposition reaction, sulfuric acid decomposition reaction, hydroxide fractional precipitation and so on) to reduce insoluble components such as impurities or the like, further subjected to a solvent extraction, as needs arise, to reduce rare earths such as neodymium, and thereby a cerium-containing rare earth salt solution is obtained. To the cerium-containing rare earth salt solution, a precipitating agent (ammonium hydrogen carbonate, aqueous ammonia, sodium hydrogen carbonate, sodium carbonate, oxalic acid and so on) is added to generate a precipitate (rare earth carbonate, rare earth hydroxide, rare earth oxalate and so on), and thereby a cerium salt is obtained (the Japanese Patent Application Laid-Open No. 2002-371267).

Furthermore, since the cerium-containing rare earth salt solution costs much in transportation or storage thereof, in some cases, the rare earth salt solution is concentrated under heating, followed by being cooled and solidified to obtain rare earth chloride or the like. After transporting or storing, the rare earth chloride is dissolved with water or diluted acid again to be used as the cerium-containing rare earth solution.

Furthermore, as shown in the Japanese Patent Application Laid-Open No. 2002-371267, thus obtained cerium salt (rare earth carbonate, rare earth hydroxide, rare earth oxalate and so on), as needs arise, is further subjected to filtration, pulverization, chemical processing such as mineral acid processing or fluorination, dewatering, drying and so on.

Among cerium salts, as a producing method of cerium carbonate, various methods are known besides the above-mentioned producing method of rare earth carbonate (cerium salt). One of those generally used is a method where carbonate groups more than equivalent amount to rare earth ions are charged to obtain fine carbonate powder (Japanese Patent Application Laid-Open No. 53-095900). Furthermore, there are also a method where, in order to further purify, for instance to reduce insoluble components of alkaline earth metals, crude rare earth oxide is dissolved in a mineral acid aqueous solution, the rare earth metals are precipitated as oxalates in an acidic region where alkali earth metals are difficult to precipitate, and the oxalates are calcined to obtain oxides, further dissolved again in mineral acid such as hydrochloric acid, nitric acid or the like to precipitate as a carbonate; a method where rare earth elements and alkali earth elements are separated by means of an ion exchange method or a solvent extraction method; and a method where when cerium carbonate is generated from a cerium mineral acid salt aqueous solution the pH of the cerium mineral acid salt aqueous solution is kept in a definite range (Japanese Patent Application Laid-Open No. 07-144915) and so on.

Disclosure of Invention

However, when cerium oxide that is produced by processing at high temperatures the cerium salt obtained according to those methods is used as polishing particles in a cerium oxide based polishing slurry, it is difficult to reduce the scratch on a surface being polished.

The invention intends to provide a cerium based polishing slurry that can be used with reduced scratch in a field where a material surface is necessary to be precisely polished, in particular in semiconductors, liquid crystal displays, hard discs and so on, cerium oxide used therein as the polishing particles, a cerium salt that is a raw material used to produce the cerium oxide and a producing method thereof.

The inventors, after studying hard to reduce the scratch when the cerium based polishing slurry is used, found that the scratch can be reduced when an amount of fine particles of impurities and so on contained in cerium oxide particles used in the cerium based polishing slurry and cerium salt particles that are raw material of the cerium oxide particles is reduced, and came to the invention.

That is, the invention relates to (1) through (11) below.

(1) A cerium salt where, when 20 g of the cerium salt is dissolved in a mixed liquid of 12.5 g of 6N nitric acid and 12.5 g of a 30% hydrogen peroxide aqueous solution, a concentration of an insoluble component present in the solution is 5 ppm or less by mass ratio.

(2) The cerium salt according to the (1), wherein the insoluble component is a substance containing silicon.

(3) A producing method of a cerium salt where through steps of obtaining one kind or a plurality of kinds of cerium-containing intermediates from a cerium compound a precipitating agent is added to obtain a precipitate of cerium salt, wherein at least one step of separating and removing an insoluble component from the cerium-containing intermediate in a solution state is included.

(4) The producing method of a cerium salt according to the (3), including a step of adding a precipitating agent to the cerium-containing rare earth salt solution to obtain a precipitate of the cerium salt, wherein a precipitating agent from which an insoluble component is removed in advance is added to the cerium-containing rare earth salt solution to precipitate.

(5) The producing method of a cerium salt according to the (3) or (4), further including a step of obtaining a solution by mixing the cerium salt and 6N nitric acid, a step of separating and removing an insoluble component in the solution, and a step of adding after the removal a precipitating agent to precipitate a purified cerium salt.

(6) The producing method of a cerium salt according to any one of the (3) through (5), wherein the precipitating agent is in a solution state where the precipitating agent is dissolved in advance in a solvent to separate and remove the insoluble component.

(7) Cerium oxide obtained by subjecting the cerium salt obtained according to the (1) or (2) or the cerium salt obtained according to the producing method according to any one of the (3) through (6) to a high temperature process of 250° C. or more.

(8) The cerium oxide according to the (7), wherein when 20 g of the cerium oxide is dissolved in a mixed liquid of 12.5 g of 6N nitric acid and 12.5 g of a 30% hydrogen peroxide aqueous solution, a concentration of an insoluble component present in the solution is 10 ppm or less by mass ratio.

(9) Cerium oxide in which when 20 g of the cerium oxide is dissolved in a mixed liquid of 12.5 g of 6N nitric acid and 12.5 g of a 30% hydrogen peroxide aqueous solution, a concentration of an insoluble component present in the solution is 10 ppm or less by mass ratio.

(10) A cerium based polishing slurry that contains the cerium oxide according to any one of the (7) through (9).

(11) A cerium based polishing slurry in which when 20 g of the cerium based polishing slurry is dissolved in a mixed liquid of 12.5 g of 6N nitric acid and 12.5 g of a 30% hydrogen peroxide aqueous solution, a concentration of an insoluble component present in the solution is 10 ppm or less by mass ratio.

BEST MODE FOR CARRYING OUT THE INVENTION

In what follows, embodiments according to the invention will be detailed.

As a producing method of a cerium salt in the invention, for instance, a method below can be cited.

(1) In the beginning, as a cerium compound as a raw material, an ore containing rare earths containing at least cerium is prepared. By means of a mineral processing such as separation, acid leaching or the like, other valuable matters and unnecessary veinstones are removed therefrom, and thereby a rare earth concentrate that is a first cerium-containing intermediate is obtained.

Here, as the ore containing rare earths containing at least cerium, for instance, bastnaesite ore, heavy sand, parankerite and so on can be cited. Furthermore, as the rare earth concentrate, bastnaesite concentrate, monazite concentrate, Chinese complex concentrate and so on can be cited.

(2) In the next place, the rare earth concentrate is chemically processed to reduce an insoluble component such as impurities and so on, and, as needs arise, further solvent-extracted to reduce rare earths such as neodymium and so on, and thereby a cerium-containing rare earth salt solution that is a second cerium-containing intermediate is obtained. Here, as the chemical processing, an alkali decomposition reaction, a sulfuric acid decomposition reaction, a hydroxide fractional precipitation and so on can be cited.

(3) To the cerium-containing rare earth salt solution, a precipitating agent is added to obtain a precipitate of a cerium salt. The cerium salt, as needs arise, is filtered and dried. As the precipitating agent, for instance, ammonium hydrogen carbonate, aqueous ammonia, sodium hydrogen carbonate, sodium carbonate, oxalic acid and so on can be cited. Furthermore, as the cerium salt, for instance, rare earth carbonate (cerium carbonate), rare earth hydroxide (cerium hydroxide), rare earth oxalate (cerium oxalate) and so on can be cited.

The cerium salt may be a hydrated one.

The producing method of a cerium salt according to the invention is characterized in that, in a producing method of a cerium salt where the cerium salt is obtained through a cerium-containing intermediate from a raw material as mentioned above, at least one of a step where an insoluble component such as impurity particles or the like is isolated and removed from a cerium-containing intermediate by means of solid-liquid separation is disposed before a step of adding a precipitating agent to obtain a precipitate of a cerium salt like the (3).

In the step where the insoluble component particles are isolated and removed, the cerium-containing intermediate is in a solution state, for instance, a cerium-containing rare earth salt solution can be cited. Preferably, immediately before the step (3) of adding the precipitating agent, a step of isolating and removing the insoluble component from the cerium-containing rare earth salt solution is disposed.

As the method of solid-liquid separating and removing the insoluble component particles, for instance, a centrifugal separation method, a filtration method and so on can be cited. In a method of isolating and removing the insoluble component by use of the centrifugal separation method, with a centrifugal separator, for instance under the conditions of a centrifugal radius of 10 cm and the revolution number of 2000 rpm, a centrifugal separation time is preferably set at 5 min, more preferably at 10 min, further more preferably at 30 min and particularly preferably at 120 min. When the centrifugal separation time is less than 5 min, in some cases, the insoluble component is insufficiently separated. Furthermore, when the revolution number is appropriately altered, the centrifugal separation time can be adjusted. For instance, when the revolution number and the centrifugal separation time are made larger, an amount of removed insoluble component increases.

When the filtration method is used to separate and remove the insoluble component, a pore diameter of a filter used is preferably 10 µm, more preferably 1 µm, further more preferably 0.5 µm and particularly preferably 0.05 µm. When a pore diameter of a filter is larger than 10 µm, since the pore diameter is too large, larger particles such as 0.05 µm or more tend to be insufficiently captured. For instance, when the pore diameter is made smaller, an amount of removed insoluble component becomes large. Furthermore, a stepwise filtration can be carried out by plurally combining the filters to be used, including a filter having a large pore diameter including those of 10 µm or more and a filter having a small pore diameter, thereby to make the filter having a larger pore diameter to capture larger particles and thereafter the filter having a smaller pore diameter to capture smaller particles. When the stepwise filtration is applied, larger amount of insoluble component tends to be removed.

A material of the filter, as far as it is not dissolved owing to the cerium-containing rare earth salt solution being filtered and so on, a metal component thereof is not eluted and the swelling and so on thereof is small, is not particularly limited. Ones made of a fluorinated resin, polypropylene, polyethylene and so on can be cited.

The filtration is effective in the solid-liquid separation of the insoluble component in all steps where the cerium-containing intermediate is in a solution state. However, it is particularly effective in the separation and removal of an insoluble component in the cerium-containing rare earth salt solution, which is applied immediately before charging the precipitating agent.

In the invention, the precipitating agent that is added to the cerium-containing intermediate from which the insoluble component has been separated and removed, preferably a cerium-containing rare earth salt solution, is effectively used if an insoluble component is previously separated and removed before addition.

As the precipitating agent, for instance, ammonium hydrogen carbonate, aqueous ammonia, sodium hydrogen carbonate, sodium carbonate, oxalic acid and so on can be cited. When the precipitating agent is a solid matter, in order to separate and remove the insoluble component, firstly the solid precipitating agent is dissolved in a solvent to prepare a precipitating agent solution. Pure water can be cited as the solvent.

As for a method of separating and removing the insoluble component particles, for instance, similarly to a case of the insoluble component particles in the cerium-containing intermediate, a centrifugal separation method, a filtration method and so on can be cited. Preferable conditions of the respective separating and removing methods are also the same. Thus obtained precipitating agent in a solution state is used.

When 20 g of the cerium salt according to the invention is dissolved in a mixed liquid of 12.5 g of 6N nitric acid and 12.5 g of a 30% hydrogen peroxide aqueous solution, a concentration of an insoluble component present in the solution (hereinafter also referred to as an insoluble component in the cerium salt) is 5 ppm or less by mass ratio to the cerium salt before dissolving in the mixed liquid. When the concentration of the insoluble component exceeds 5 ppm, an amount of fine particles of the impurity contained in the cerium salt particles becomes much, and thereby much scratches are generated.

From a viewpoint of reducing the scratch, the concentration of the insoluble component in the cerium salt, by mass ratio to the cerium salt before dissolution, is preferably 1 ppm or less, and more preferably 0.1 ppm or less. The cerium salt according to the invention can be produced for instance as mentioned above.

As a measurement method of the concentration of the insoluble component in the cerium salt, for instance, a volume method, a weight method can be cited.

In the volume method, the cerium salt is dissolved in a mixed liquid of nitric acid and aqueous hydrogen peroxide, followed by filtering with an analyzing filter, and particles of the insoluble component on the filter are observed with a scanning electron microscope to measure a volume thereof. As a method of obtaining a volume of a particle, a method can be cited where a particle diameter of the particle on the filter is obtained from a Green diameter, a Martin's diameter, a biaxial average diameter, an axial geometric average diameter or the like, and sphere approximated to the diameter is obtained, thereby a volume is obtained.

In the weight method, a cerium salt-dissolved aqueous solution of nitric acid and aqueous hydrogen peroxide is filtered by use of an analyzing filter and a weight difference of the filter before and after the filtration is measured. Furthermore, there are methods as well due to an instrumental analysis such as an atomic absorption analysis, an ICP analysis, a fluorescent X-ray analysis or the like.

In the invention, for measuring the concentration of the insoluble component, a method where a ratio of a mass of the insoluble component particles to that of the cerium salt particles before dissolution is calculated is adopted. Namely, the respective particles of the insoluble component are approximated to spheres each having a diameter of a square root of a product of a major axis and a minor axis thereof to obtain a total volume thereof, and furthermore, with the insoluble component assumed as silicon dioxide, the specific gravity thereof, that is, 2.6 is multiplied to the total volume, thus a total mass of the insoluble component is obtained.

The smaller in the amount and the diameter the insoluble component in the cerium salt is, the more preferable it is. For instance, particle diameters of the insoluble component separated and removed from the cerium-containing intermediate in a solution state and the insoluble component separated and removed from the precipitating agent are preferably more than 0.05 µm. And the insoluble component in the obtained cerium salt preferably has a diameter of 0.05 µm or less. The insoluble component of which particle diameter is 0.05 µm or less is difficult to affect on the generation of the scratch during polishing.

In the invention, the particle diameter of the insoluble component, similarly to the above measurement of the concentration, is obtained by approximating each of the particles to a sphere having a diameter of a square root of a product of a major axis and a minor axis thereof.

The insoluble component in the cerium salt is preferably a substance containing silicon. Since a substance containing silicon like silicon dioxide tends to generate the scratch on a surface being polished at the polishing, whether the silicon is less in the content and smaller in the diameter or not can be adopted as an index of a cerium salt from which an excellent polishing slurry is obtained. Examples of substance containing silicon include an artificial one such as silicon nitride and silicon carbide, and a natural one such as silicon dioxide, olivine, zircon, carbuncle, topaz and so on.

Furthermore, the present invention include a producing method of a cerium salt where after a commercially available cerium salt is dissolved in 6N nitric acid, similarly to the above, an insoluble component insoluble in the solution is separated and removed, thereafter a precipitating agent is added to obtain a precipitate of a purified cerium salt, and as needs arise, followed by filtering and drying, and a producing method of a cerium salt where in the above in particular as the precipitating agent, a precipitating agent solution from which an insoluble component is previously separated and removed similarly to the above issued, and a purified cerium salt obtained therefrom as well.

The cerium salt is oxidized to obtain cerium oxide. As the cerium salt, for instance, one obtained according to the above producing method of a cerium salt can be used. As an oxidizing method, for instance, heating (calcining) can be cited. In the case of heating, a high temperature process is carried out preferably at 250° C. or more, and more preferably at a temperature in the range of 300 to 1000° C.

From a viewpoint of reducing the scratch, when 20 g of the cerium oxide according to the invention is dissolved in a mixed liquid of 12.5 g of 6N nitric acid and 12.5 g of a 30% hydrogen peroxide aqueous solution, a concentration of an insoluble component present in the solution is preferably 10 ppm or less by mass ratio to the cerium oxide before dissolving in the mixed liquid. When the concentration of the insoluble component exceeds 10 ppm, much scratches are generated. The measurement method of the concentration and preferable particle diameter of the insoluble component are the same as the case of the cerium salt.

As a cerium oxide polishing slurry that is used to polish a silicon oxide film formed according to a TEOS-CVD method, the larger a primary particle diameter and the less the crystal strain are, that is, the more excellent the crystallinity is, the higher the polishing speed is, however, the more polishing scratches tend to be generated. In this connection, in the cerium oxide particles according to the invention, though a producing method thereof is not limited, an average value of primary particle diameters of the cerium oxide is preferably 5 nm or more and 300 nm or less. The primary particle means a particle corresponding to a crystallite that is measured and observed with a SEM (scanning electron microscope) and surrounded by a grain boundary.

Since the cerium oxide particles manufactured by the above method are easily flocculated, it is preferable that the cerium oxide particles are mechanically pulverized. Preferable examples of pulverizing methods include a dry pulverizing method using a jet mill or the like, and a wet pulverizing method using a planet bead mill or the like. The jet mill is described in, for example, Chemical Engineering Paper Collection (Kagaku Kougaku Ronbunshu), vol. 6, No. 5 (1980), 527-532.

When a composition containing the cerium oxide particles is dispersed in water, a cerium based polishing slurry can be obtained. A cerium oxide produced according to the above method can be used. In the cerium based polishing slurry, as needs arise, a solvent other than water, a dispersing agent, a polymer additive, a pH adjuster and so on are appropriately contained. The cerium based polishing slurry can be used in the CMP (Chemical Mechanical Polishing) polishing.

A concentration of the cerium oxide particles in the cerium based polishing slurry is not particularly limited. However, from a viewpoint of easy handling of a dispersion, the concentration is preferably in the range of 0.5 mass percent or more and 20 mass percent or less, more preferably in the range of 1 mass percent or more and 10 mass percent or less and particularly preferably in the range of 1.5 mass percent or more and 5 mass percent or less.

The cerium based polishing slurry is prepared for instance as shown below. In the dispersing agent, being used also in the polishing of semiconductor elements, contents of alkali metals such as sodium ion, potassium ion and so on, halogen and sulfur are preferably suppressed to 10 ppm or less. Accordingly, a polymer dispersing agent containing for instance ammonium acrylate as a copolymer component can be preferably used.

An amount of a dispersing agent added is preferably in the range of 0.01 parts by weight or more and 5.0 parts by weight or less to 100 parts by weight of cerium oxide particles from viewpoint of the dispersibility of particles in a slurry-like polishing slurry and inhibition of the particles from precipitating, furthermore, from relationship between the scratches and an amount of the dispersing agent added.

A weight average molecular weight of the dispersing agent is preferably in the range of 100 to 50,000, and more preferably in the range of 1,000 to 10,000. When the molecular weight of the dispersing agent is less than 100, a sufficient polishing speed cannot be obtained when a silicon oxide film or a silicon nitride film is polished. On the other hand, when the molecular weights of the dispersing agent and the polymer additive exceed 50,000, the viscosity tends to become high, resulting deteriorate the storage stability of the cerium based polishing slurry. The weight average molecular weight is a value measured according to the gel permeation chromatography method and calculated based on reference polystyrene.

As a method of dispersing cerium oxide particles in water, other than a dispersion with a normal agitator, a homogenizer, a ultrasonic disperser, a wet ball mill or the like can be used.

A median value of secondary particle diameters of the cerium oxide particles in the cerium based polishing slurry is preferably in the range of 0.01 to 1.0 μm, more preferably in the range of 0.03 to 0.5 μm and particularly preferably in the range of 0.05 to 0.3 μm. When the median value of the secondary particle diameters is less than 0.01 μm, the polishing speed tends to be slower, and when it exceeds 1.0 μm, the scratches are likely to occur on a surface of a film being polished. The median value of the secondary particle diameters of the cerium oxide particles in the cerium based polishing slurry can be measured according to a photon correlation method with for instance a particle size distribution analyzer (for instance, trade name: Mastersizer Micro Plus, manufactured by Malvern Instruments Ltd.).

The pH of the cerium based polishing slurry is preferably 3 or more and 9 or less and more preferably 5 or more and 8 or less. When the pH is smaller than 3, a chemical action force tends to become smaller, and the polishing speed tends to decrease.

When the pH is larger than 9, there is a risk that the chemical action force becomes too strong, and a surface being polished is dissolved to be dish-like (dishing).

From a viewpoint of reducing the scratch, when 20 g of the cerium based polishing slurry is dissolved in a mixed liquid of 12.5 g of 6N nitric acid and 12.5 g of a 30% hydrogen peroxide aqueous solution, a concentration of an insoluble component present in the solution is preferably, by mass ratio, 10 ppm or less, more preferably 5 ppm or less, still more preferably 1 ppm or less and particularly preferably 0.1 ppm or less. When the concentration of the insoluble component exceeds 10 ppm, there is a problem in that much scratches are generated. The measurement method of the concentration and a preferable particle diameter of the insoluble component in the cerium based polishing slurry are the same as the case of the cerium salt except that a dried matter containing cerium oxide particles obtained by drying the cerium based polishing slurry is used to measure.

Here, the dried matter containing other components than the cerium oxide particles is used. This is because the cerium oxide particles and other components are difficult to separate after the drying. However, since a content of the other components is very small compared to the content of the cerium oxide particles, there is considered no problem.

Example 1

In what follows, the invention will be specifically detailed with reference to examples. However, the invention is not limited to the examples.

(Purification of Cerium Carbonate)

Into 150 g of 6N nitric acid, 240 g of commercially available cerium carbonate hexahydrate was dissolved, and thereby 390 g of a cerium carbonate solution was obtained. The solution of 390 g was subjected to a centrifugal separation at the revolution number of 1000 rpm for 120 min. Immediately after a separator is stopped, 350 g of supernatant liquid was sampled.

In 250 g of pure water, 50 g of ammonium hydrogen carbonate was dissolved, followed by filtering with a 0.1 μm filter. The filtrate was added to 350 g of the above sampled supernatant liquid and a precipitate of cerium carbonate was obtained. When the precipitate was recovered, cleansed and dried, a recovery rate of cerium was substantially 100%.

The above operation was repeated, and thereby 6 kg in total of cerium carbonate hexahydrate (hereinafter, referred to as cerium carbonate) was prepared.

Into a mixed liquid of 12.5 g of 6N nitric acid and 12.5 g of 30% hydrogen peroxide aqueous solution, 20 g of the purified cerium carbonate was added, followed by leaving under normal temperature and pressure for 170 hr to completely dissolve, further followed by filtering with suction with a filter having a pore diameter of 0.05 μm, and thereby an insoluble component was collected. The filter was observed with a scanning electron microscope, all insoluble components observed in a viewing field under a magnification of 200 times were approximated to spheres each having a diameter of a square root of a product of a major axis and a minor axis thereof, and thereby a total volume was obtained. Furthermore, with the insoluble component assumed as silicon dioxide, the specific gravity thereof, 2.6, and the total volume were multiplied to obtain a total mass of the insoluble component. To 20 g of mass of cerium carbonate used in the dissolution, a ratio of the mass of the insoluble component was calculated and found to be 0.1 ppm.

(Preparation of Cerium Oxide)

In the next place, substantially 6 kg of the obtained cerium carbonate was charged in an alumina container, followed by calcining at 800° C. in air for 2 hr, and thereby substantially 3 kg of yellowish-white powder was obtained. The powder was subjected to the phase identification by means of the X-ray diffraction method and confirmed to be cerium oxide. A particle diameter of the calcined powder was in the range of 30 to 100 μm. Furthermore, 3 kg of the obtained cerium oxide powder was pulverized in dry by use of a jet mill and thereby cerium oxide particles were obtained.

(Preparation of Cerium Based Polishing Agent)

One thousand grams of the above-prepared cerium oxide particles, 40 g of an ammonium polyacrylate aqueous solution (40 mass percent) and 8960 g of deionized water were blended, followed by applying the ultrasonic dispersion under agitation for 10 min, and thereby a cerium based polishing slurry was prepared. The obtained polishing slurry was filtered with a filter with a pore diameter of 1 μm. Particles in the polishing slurry were measured of a stock liquid (the polishing slurry after the filtration) by use of a laser diffraction particle size distribution analyzer (trade name: Mastersizer Micro Plus, manufactured by Malvern Instruments Ltd.) under the conditions of the refractive index: 1.9285, light source: He—Ne laser and no absorption and an average value of secondary particle diameters was 200 nm.

Twenty grams of a dried matter containing cerium oxide particles obtained by drying the cerium based polishing slurry was dissolved in nitric acid and aqueous hydrogen peroxide under the same conditions as that of the purified cerium carbonate. The solution was filtered with an analyzing filter under the same conditions as that of the purified cerium carbonate, followed by observing an insoluble component on the filter with a scanning electron microscope and obtaining a mass thereof, and thereby a ratio of a mass of the insoluble component to a mass of 20 g of the cerium oxide used in the dissolution was found to be 0.2 ppm.

Furthermore, with the polishing slurry, the polishing was applied according to a method below. When a surface of a wafer was observed with an optical microscope, there was found no definite scratch.

(Polishing Test Method)

Polishing load: 30 kPa

Polishing pad: Foamed polyurethane resin (trade name: IC-1000, manufactured by Rodel Inc.)

Revolution number: Upper plate 75 rpm, polishing pad 75 rpm

Feed speed of polishing slurry: 200 mL/min and

Object being polished: P-TEOS layered Si wafer (200 mm in diameter)

Example 2

(Purification of Cerium Carbonate)

With filters respectively having pore diameters of 10.0 μm, 5.0 μm, 1.0 μm and 0.1 μm, 390 g of a cerium carbonate-dissolved solution prepared under the same conditions as that of example 1 was filtered stepwise with suction, and thereby a filtrate of 390 g was sampled.

To 390 g of the filtrate, a filtrate of ammonium hydrogen carbonate obtained by dissolving and filtering under the same conditions as that of example 1 was added, and thereby a precipitate of cerium carbonate was obtained. When the precipitate was recovered, cleansed and dried, a recovery rate of cerium was substantially 100%.

The above operation was repeated and 6 kg in total of cerium carbonate was prepared.

In nitric acid and aqueous hydrogen peroxide, 20 g of the purified cerium carbonate was dissolved under the same conditions as that of the case of cerium carbonate purified in example 1, followed by filtering with an analyzing filter, further followed by observing with a scanning electron microscope, and thereby a total mass of an insoluble component was obtained. A ratio by mass of the insoluble component in 20 g by mass of cerium carbonate was calculated and found to be 0.1 ppm.

(Preparation of Cerium Oxide)

Substantially 6 kg of the obtained cerium carbonate was charged into an alumina container, followed by calcining at 800° C. in air for 2 hr, and thereby substantially 3 kg of yellowish white powder was obtained. The powder was subjected to the phase identification by means of the X-ray diffraction method and confirmed to be cerium oxide. A particle diameter of the calcined powder was in the range of 30 to 100 μm. Furthermore, 3 kg of the obtained cerium oxide powder was pulverized in dry by use of a jet mill and thereby cerium oxide particles were obtained.

(Preparation of Cerium Based Polishing Agent)

From 1000 g of the above-prepared cerium oxide particles, under the same conditions as that of example 1, a cerium based polishing slurry was prepared. When a particle size was measured, an average value of secondary particle diameters was 200 nm.

Twenty grams of a dried matter containing cerium oxide particles obtained by drying the cerium based polishing slurry was dissolved in nitric acid and aqueous hydrogen peroxide under the same conditions as that of the purified cerium carbonate. The solution was filtered with an analyzing filter under the same conditions as that of the purified cerium carbonate, followed by observing an insoluble component on the filter with a scanning electron microscope and obtaining a mass thereof, and thereby a ratio of a mass of the insoluble component to a mass of 20 g of the cerium oxide used in the dissolution was found to be 0.2 ppm. Furthermore, with the polishing slurry, the polishing was applied according to a test method under the same conditions as that of example 1. When a surface of a wafer was observed with an optical microscope, there was found no definite scratch.

Comparative Example 1

(Insoluble Component of Cerium Oxide)

Into a mixed liquid of 12.5 g of 6N nitric acid and 12.5 g of 30% aqueous hydrogen peroxide, 20 g of commercially available cerium carbonate was added, followed by leaving under normal temperature and pressure for 170 hr to completely dissolve, further followed by filtering with suction with a filter having a pore diameter of 0.05 μm, and thereby an insoluble component was collected. The filter was observed with a scanning electron microscope, and a total mass of the insoluble component was obtained under the same conditions as that of example 1. To a mass of cerium carbonate used in the dissolution, a ratio of the mass of the insoluble component was calculated and found to be 7.8 ppm.

(Preparation of Cerium Oxide)

Six kg of the commercially available cerium carbonate was charged into an alumina container, calcined at 800° C. in air for 2 hr, and thereby substantially 3 kg of yellowish white powder was obtained. The powder was subjected to the phase identification by means of the X-ray diffraction method and confirmed to be cerium oxide. A particle diameter of the calcined powder was in the range of 30 to 100 μm. Furthermore, 3 kg of the obtained cerium oxide powder was pulverized in dry by use of a jet mill and thereby cerium oxide particles were obtained.

(Preparation of Cerium Based Polishing Agent)

From 1000 g of the above-prepared cerium oxide particles, under the same conditions as that of example 1, a cerium based polishing slurry was prepared and polishing particles were measured. Trade name: Mastersizer 3000HS manufactured by Malvern Instruments Ltd. as a laser diffraction particle size distribution analyzer was used to measure. As a result, an average value of secondary particle diameters was 200 nm.

Twenty grams of a dried matter containing cerium oxide particles obtained by drying the cerium based polishing slurry was dissolved in nitric acid and aqueous hydrogen peroxide under the same conditions as that of the purified cerium carbonate described in example 1. The solution was filtered with an analyzing filter under the same conditions as that of the purified cerium carbonate, followed by observing an insoluble component on the filter with a scanning electron microscope and measuring a mass thereof, and thereby a ratio of a mass of the insoluble component to a mass of 20 g of the cerium oxide used in the dissolution was found to be 12.0 ppm. With the polishing slurry, the polishing was applied according to a test method under the same conditions as that of example 1. When a surface of a wafer was observed with an optical microscope, there was found 30 scratches per a wafer.

Industrial Applicability

According to the present invention, a high purity cerium salt in which an insoluble component such as impurity particles is reduced can be provided. Furthermore, since a polishing slurry that uses cerium oxide manufactured from the cerium salt can polish without generating a scratch on a film being polished, the polishing slurry is considered to have a great deal of potential in a semiconductor field where precise polishing is demanded.

The invention claimed is:

1. A producing method of a cerium based polishing slurry, which comprises
   preparing a cerium salt,
   dissolving the cerium salt in 6N nitric acid to obtain a solution,
   separating and removing an insoluble component in the solution,
   adding a precipitating agent to obtain a precipitate of a purified cerium salt after said removing, and
   oxidizing the purified cerium salt to obtain cerium oxide.

2. The producing method of a cerium based polishing slurry according to claim 1, wherein said separating and removing is executed so that when 20 g of the cerium salt is dissolved in a mixed liquid of 12.5 g of 6N nitric acid and 12.5 g of a 30% hydrogen peroxide aqueous solution, a concentration of an insoluble component present in the solution is 5 ppm or less by mass ratio.

3. The producing method of a cerium based polishing slurry according to claim 1, wherein the insoluble component is a substance containing silicon.

4. The producing method of a cerium based polishing slurry according to claim 1, which comprises further following steps before preparing the cerium salt:
   obtaining cerium-containing intermediate solution from a cerium compound,
   adding a precipitating agent to the cerium-containing intermediate solution to obtain a precipitate of a cerium salt.

5. The producing method of a cerium based polishing slurry according to claim 4, wherein an insoluble component in the precipitating agent is previously separated and removed.

6. The producing method of a cerium based polishing slurry according to claim 4, wherein the precipitating agent is in a solution state where the precipitating agent is dissolved in advance in a solvent and the insoluble component is separated and removed.

7. The producing method of a cerium based polishing slurry according to claim 1, which comprises
   subjecting said purified cerium salt to a high temperature process of 250° C. or more.

8. The producing method of a cerium based polishing slurry according to claim 1, which further comprises pulverizing the cerium oxide mechanically.

9. The producing method of a cerium based polishing slurry according to claim 1, which further comprises dispersing the cerium oxide in water.

10. The producing method of a cerium based polishing slurry according to claim 9, which further comprises adding a dispersing agent.

11. The producing method of a cerium based polishing slurry according to claim 10, wherein a weight average molecular weight of the dispersing agent is in the range of 100 to 50,000.

12. The producing method of a cerium based polishing slurry according to claim 9, which further comprises adjusting a median value of secondary particle diameters of the cerium oxide particles in the cerium based polishing slurry to a range of 0.01 to 1.0 μm.

13. The producing method of a cerium based polishing slurry according to claim 1, wherein the cerium salt includes cerium carbonate.

* * * * *